United States Patent [19]

Fellner et al.

[11] Patent Number: 5,736,018
[45] Date of Patent: Apr. 7, 1998

[54] DEVICE FOR HOLDING COMPONENTS DURING ELECTRODE APPLICATION

[75] Inventors: Siegfried Fellner, Preitenegg; Sigurd Greiderer, Feldkirchen; Norbert Landfahrer, Deutschlandsberg; Robert Karner; Helmut Schwab, both of Graz, all of Austria

[73] Assignee: Siemens Matsushita Components GmbH & Co. KG, Munich, Germany

[21] Appl. No.: 699,633

[22] Filed: Aug. 19, 1996

[30] Foreign Application Priority Data

Aug. 18, 1995 [DE] Germany ............. 295 13 315.5

[51] Int. Cl.⁶ .................................................. C25D 17/04
[52] U.S. Cl. .................. 204/297 R; 118/500; 118/503; 118/428
[58] Field of Search ............................... 118/500, 503, 118/428; 204/297 R

[56] References Cited

U.S. PATENT DOCUMENTS 4,526,129   7/1985   Braden ...................... 118/503

FOREIGN PATENT DOCUMENTS 2555361   5/1985   France .

*Primary Examiner*—Bruce F. Bell
*Attorney, Agent, or Firm*—Herbert L. Lerner; Laurence A. Greenberg

[57] ABSTRACT

A device for holding components during electrode application includes two rigid plates having openings formed therein. An elastic material lines the openings in the plates and defines free spaces in the elastic material for receiving components.

1 Claim, 1 Drawing Sheet

DEVICE FOR HOLDING COMPONENTS DURING ELECTRODE APPLICATION

BACKGROUND OF THE INVENTION

1. Field of the Invention

The present invention relates to a device for holding components during electrode application.

Until now, electrodes, for instance for ceramic surface mounted device (SMD) components, have been applied in succession in a plurality of production steps, which is not cost-effective.

SUMMARY OF THE INVENTION

It is accordingly an object of the invention to provide a device for holding components during electrode application, which overcomes the hereinafore-mentioned disadvantages of the heretofore-known devices of this general type and which provides the possibility of applying electrodes in a single production step.

With the foregoing and other objects in view there is provided, in accordance with the invention, a device for holding components during electrode application, comprising two rigid plates having openings formed therein; and an elastic material lining the openings in the plates and defining free spaces in the elastic material for receiving components.

In accordance with a concomitant feature of the invention, the elastic material defines a length of the free spaces for holding jacket surfaces of components having adjoining opposed end surfaces on which electrodes are disposed.

Other features which are considered as characteristic for the invention are set forth in the appended claims.

Although the invention is illustrated and described herein as embodied in a device for holding components during electrode application, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
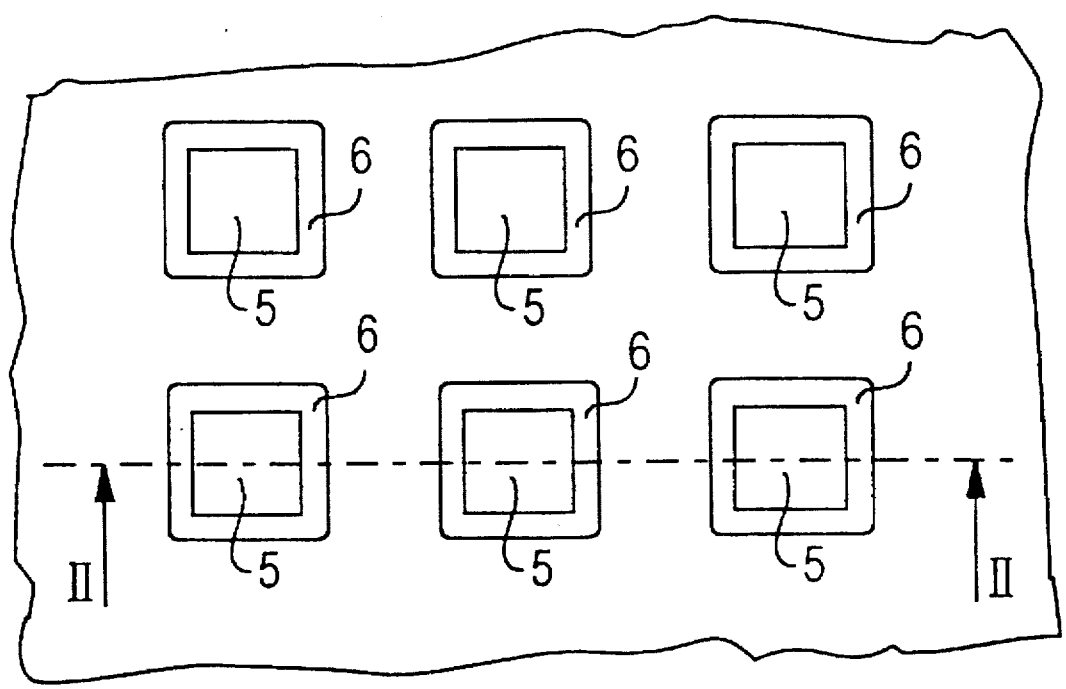
FIG. 1 is a fragmentary, diagrammatic, plan view of a device according to the invention.
Figure 2:
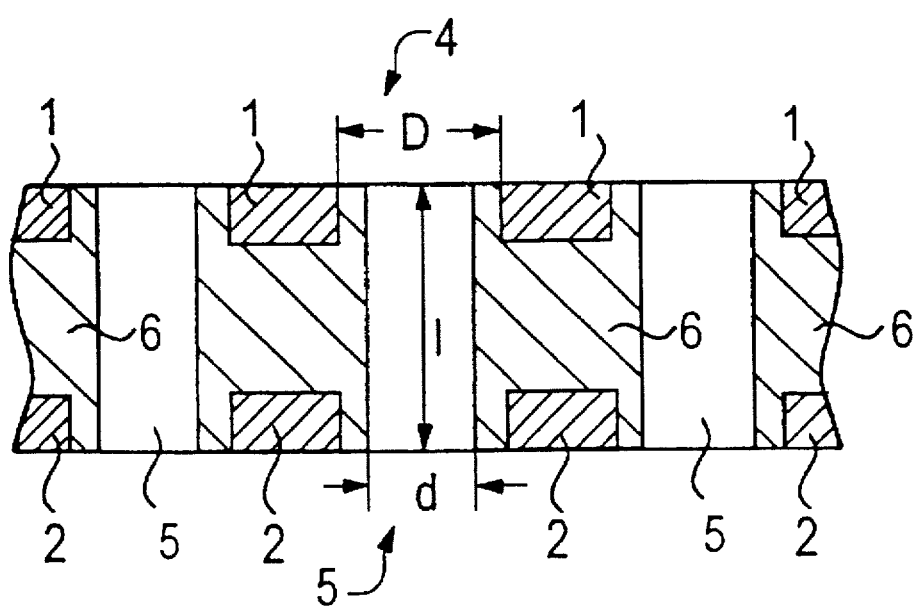
FIG. 2 is a sectional view taken along a plane II—II of FIG. 1, in the direction of the arrows.

Referring now in detail to FIGS. 1 and 2 of the drawings as a whole, there is seen a device according to the invention for holding components during electrode application, in which two rigid plates 1, 2, for instance of steel, are provided with openings 4 having a width D. The openings 4 are lined with an elastic material 6 in such a way that free spaces 5 for receiving components are formed therein. The free spaces 5 have a width d and a length l. The length l is chosen in such a way that non-illustrated components are held in the elastic material 6 at jacket surfaces that join opposed end surfaces to one another.

In other words, the components are supported and sealed off by the elastic material 6 between the two end surfaces to which the electrodes are to be applied. Metallizing of the end surfaces to produce the electrodes can therefore be carried out in a single step, for instance by sputtering or vapor deposition.

We claim:

1. A device for holding components during electrode application, comprising:

two rigid plates having openings formed therein; and an elastic material lining said openings in said plates and defining free spaces in said elastic material for receiving components, wherein said elastic material defines a length of said free spaces for holding jacket surfaces of components having adjoining opposed end surfaces on which electrodes are to be applied; whereby the components are held and sealed off in said openings such that the electrodes can be applied on the opposed end surfaces in a single step while the components are held and sealed in said openings.

* * * * *